(12) United States Patent
Pater (10) Patent No.: US 6,777,525 B2
(45) Date of Patent: Aug. 17, 2004

(54) HEAT, MOISTURE, AND CHEMICAL RESISTANT POLYIMIDE COMPOSITIONS AND METHODS FOR MAKING AND USING THEM

(75) Inventor: Ruth H. Pater, Yorktown, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 10/115,812

(22) Filed: Apr. 1, 2002

(65) Prior Publication Data

US 2003/0073803 A1 Apr. 17, 2003

Related U.S. Application Data

(60) Provisional application No. 60/303,741, filed on Jul. 3, 2001.

(51) Int. Cl.[7] .................. C08G 73/10; C08G 69/28; C08L 77/00; B32B 27/00
(52) U.S. Cl. .................. 528/170; 528/125; 528/128; 528/171; 528/172; 528/173; 528/174; 528/179; 528/183; 528/185; 528/188; 528/220; 528/229; 528/350; 528/353; 264/297.1; 264/297.4; 264/319; 525/420; 525/422; 525/431; 525/432; 525/437; 524/600; 524/602; 524/606; 428/364; 428/365; 428/394; 428/395; 428/411.1; 428/457; 428/458; 428/473.5; 428/901
(58) Field of Search .................. 528/125, 128, 528/170–174, 179, 183, 185, 188, 220, 229, 350, 353; 524/600, 602; 428/457–458, 473.5, 394–395, 411.1, 364–365; 525/420, 422, 322; 264/297.1

(56) References Cited

U.S. PATENT DOCUMENTS

| | | |
|---|---|---|
| 3,745,149 A | 7/1973 | Serafini et al. |
| 4,389,504 A | 6/1983 | St. Clair et al. |
| 4,497,935 A | 2/1985 | St. Clair et al. |
| 4,595,548 A | 6/1986 | St. Clair |
| 4,883,718 A | 11/1989 | Ohta et al. |
| 4,956,450 A | 9/1990 | Lee et al. |
| 4,988,544 A | 1/1991 | Cella et al. |
| 4,996,101 A | 2/1991 | Landis et al. |
| 5,041,526 A | 8/1991 | Riel et al. |
| 5,041,528 A | 8/1991 | Riel et al. |
| 5,091,505 A | 2/1992 | Serafini et al. |
| 5,145,943 A * | 9/1992 | Li et al. .................. 528/353 |
| 5,147,966 A | 9/1992 | St. Clair et al. |
| 5,171,822 A | 12/1992 | Pater |
| 5,171,828 A | 12/1992 | Meterko et al. |
| 5,175,241 A * | 12/1992 | Darrow .................. 528/353 |
| 5,189,137 A * | 2/1993 | Howson et al. .......... 528/171 |
| 5,268,446 A | 12/1993 | Tamai et al. |
| 5,412,066 A | 5/1995 | Hergenrother et al. |
| 5,644,022 A | 7/1997 | Jensen |
| 5,741,883 A | 4/1998 | Bryant |
| 5,770,676 A * | 6/1998 | Pater et al. .............. 528/188 |
| 5,866,676 A | 2/1999 | Jensen |
| 6,127,509 A | 10/2000 | Pratte et al. |
| 6,184,333 B1 * | 2/2001 | Gray .................... 528/170 |
| 6,359,107 B1 | 3/2002 | Connell et al. |

OTHER PUBLICATIONS

Katsuya Asao et al., "Polyimides (Containing Ether Linkages; Adhesive Properties)," Concise Polymeric Matls Ency., 1st ed., CRC Press (Boca Raton), p. 1202–, (Apr. 1, 1999).

* cited by examiner

Primary Examiner—P. Hampton Hightower
(74) Attorney, Agent, or Firm—Robin W. Edwards (57) ABSTRACT

Polyimides having a desired combination of high thermo-oxidative stability, low moisture absorption and excellent chemical and corrosion resistance are prepared by reacting a mixture of compounds including (a) 3,3',4,4'-benzophenonetetracarboxylic dianhydride (BTDA), (b) 3,4'-oxydianiline (3,4'-ODA), and (c) 5-norbornene-2,3-dicarboxylic anhydride (NA) in a high boiling, aprotic solvent to give 5 to 35% by weight of polyamic acid solution. The ratio of (a), (b), and (c) is selected to afford a family of polyimides having different molecular weights and properties. The mixture first forms a polyamic acid precursor. Upon heating at or above 300° C., the polyamic acids form polyimides, which are particularly suitable for use as a high temperature coating, adhesive, thin film, or composite matrix resin.

49 Claims, 1 Drawing Sheet

HEAT, MOISTURE, AND CHEMICAL RESISTANT POLYIMIDE COMPOSITIONS AND METHODS FOR MAKING AND USING THEM

CLAIM OF BENEFIT OF APPLICATION

This application claims the benefit of U.S. provisional application Serial No. 60/303,741, filed Jul. 3, 2001.

ORIGIN OF INVENTION

This invention was made by an employee of the United States Government and may be manufactured and used by or for the Government for government purposes without payment of any royalties thereon or therefore.

BACKGROUND OF THE INVENTION

1. Field of the Invention

The present invention relates generally to aromatic polyimides. It relates in particular to a heat, moisture, and chemical resistant thermosetting polyimide, which is especially useful as an advanced coating, adhesive, film, composite matrix resin, and neat resin.

2. Description of the Prior Art

Figure 1:
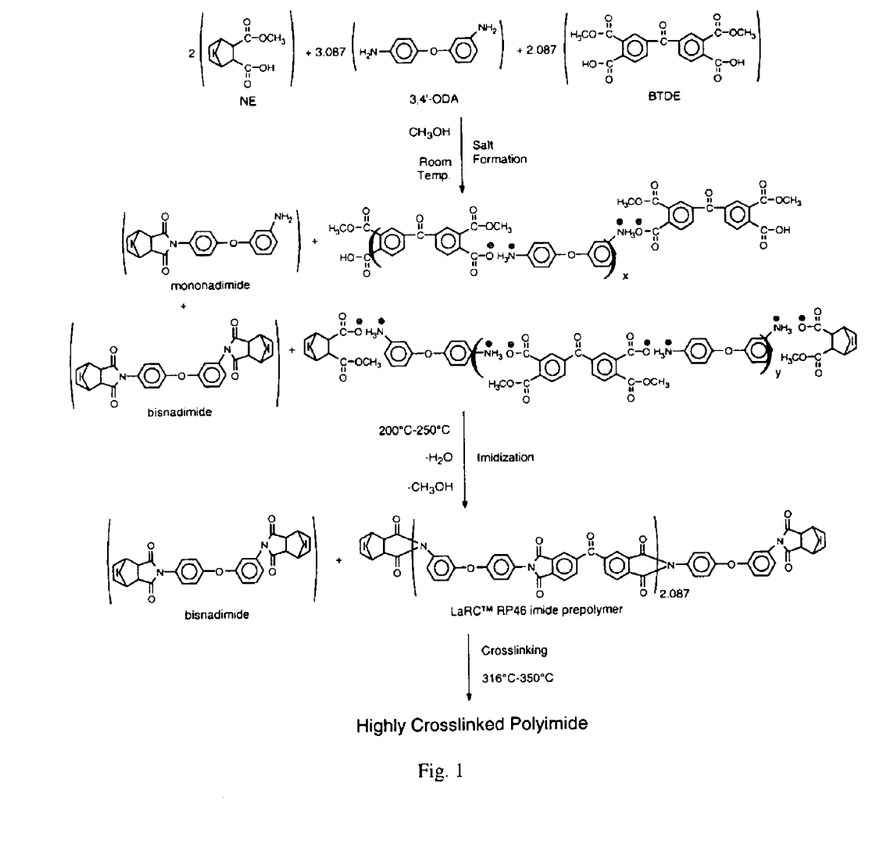
FIG. 1 shows the chemistry of LaRC RP 46 prepared by a typical PMR process

In-situ Polymerization of Monomer Reactants (PMR) polyimides has significantly advanced the field of polyimides as processable engineering materials in the past three decades. PMR polyimides are presently used as composite matrix resins in various military aircraft engine components. Of particular importance are commercially available PMR 15 (U.S. Pat. No. 3,745,149), AFR 700B (U.S. Pat. No. 5,091,505) and LaRC RP 46 (U.S. Pat. No. 5,171,822). These PMR polyimides are prepared by dissolving a monoalkyl ester of 5-norbornene-2,3-dicarboxylic acid (nadic ester, NE), an aromatic diamine, and a dialky ester of an aromatic tetracarboxylic acid in a low-boiling alcohol (e.g., methanol or ethanol). The monomeric solution is then used to impregnate the reinforcing fibers. In-situ polymerization through the nadic end group occurs directly on the fiber surfaces, producing a composite material with excellent thermal and mechanical properties. LaRC RP 46 provides an example of how PMR polyimides are typically prepared (FIG. 1). Attractive features of the PMR process include the use of a low-boiling solvent and low molecular weight, low viscosity monomers. While these features are beneficial for composite processing, they create serious drawbacks for coating, adhesive and thin film applications.

One problem encountered is that the alcohol (methanol) solvent readily evaporates to produce a loose, dry powder. The dry powder can easily fall off from the surface of a substrate. More importantly, the polyimide prepared by the PMR process is very brittle and easily fractured. As FIG. 1 demonstrates, the brittleness is caused by the chemistry: NE and dimethyl ester of 3,3'4,4'-benzophenonetetracarboxylic acid (BTDE) compete for 3,4'-oxydianiline (3,4'-ODA), and they react to form a mixture of salt complexes in an alcohol solution. NE reacts with the diamine, resulting in the formation of mononadimide and bisnadimide. In contrast, BTDE does not react with 3,4'-ODA to form a stable product in an alcohol solution. The formation of low molecular weight mononadimide and bisnadimide causes the polyimide resin to become brittle and reduces the average molecular weight between the crosslinking sites of the polyimide, producing a highly crosslinked and brittle network structure.

The brittleness and solvent evaporation problems can be solved by preparing a polyimide using a two-step, condensation methodology. When such a method is used, an anhydride and dianhydride react with a diamine in a high-boiling aprotic solvent to give a long molecular weight polyamic acid precursor through a step grow polymerization. This synthesis has multiple advantages over the PMR process for coating, adhesive and film applications. To begin with, the use of a high-boiling aprotic solvent will prevent evaporation of the solvent. Moreover, the polyamic acid solution is very tacky, which makes it easy to apply a coating, adhesive, and thin film to a substrate, and the chain extension in the solution is significantly easier than that of PMR polyimides in a molten state. In addition, because an anhydride and a dianhydride are significantly more reactive toward an aromatic diamine than their monoalkyl and dialkyl ester derivatives used in the PMR process, the reactivity difference between the anhydride and dianhydride is much smaller, compared to the reactivity disparity between the monoalkyl and dialkyl esters discussed previously. Finally, unlike the dialkyl ester, the dianhydride reacts rapidly with the aromatic diamine in an aprotic solvent, so that low molecular weight monoimide and bisimide do not form and cause the polyimide to become brittle. When the above referenced method is used, the resulting polyimide will have good flexibility and toughness, which are important properties for coating, adhesive and thin film applications.

The two-step condensation method is used almost exclusively for coating, adhesive and film applications. For example, U.S. Pat. Nos. 5,866,676, 5,147,966, and 5,741,883 disclose thermoplastic polyimides and U.S. Pat. No. 5,412,066 discloses a thermosetting polyimide, all of which were prepared by a condensation method and all of which exhibit excellent adhesive and film properties. However, they have low glass transition temperatures (Tg), which limit their use temperatures to 150° C. to 200° C. They also absorb a moderate amount of moisture (about 3%) and show poor resistance to hydraulic fluids, jet fuels, lubricating oils, common organic solvents, sea water and cleaning solutions.

SUMMARY OF THE INVENTION

Polyimides are prepared from mixtures of (a) 3,3',4,4'-benzophenonetetracarboxylic dianhydride (BTDA), (b) 3,4'-oxydianiline (3,4'-ODA), and (c) 5-norbornene-2,3-dicarboxylic anhydride (NA) in a high boiling, aprotic solvent to give 5 to 35% by weight of the polyamic acid solution. The polyamic acid is converted into the polyimide by use of a heat treatment or by chemical cyclodehydration. The mole ratio of a:b:c is n:(n+1):2, wherein n has a value of 1.0000 to 50.4025, which corresponds to a formulated molecular weight of the uncrosslinked polyimide ranging from 978 to 25,000 gram per mole. These polyimides have excellent thermo-oxidative stability and resistance to moisture and chemical induced degradations. They also have outstanding mechanical properties.

The primary objective of the present invention is to provide what the prior art failed to produce, a family of polyimides having a desired combination of heat, moisture and chemical resistance that can be used as a specialty coating, adhesive, or thin film. These polyimides have the following properties:

(1) Use temperatures ranging from −100° C. to 371° C. that can withstand a sudden temperature surge of up to 600° C.;
(2) Low moisture absorption (less than 1% after 24 hours in water at room temperature);
(3) Excellent chemical resistance to common organic solvents, hydraulic fluids, fuels, lubricating oils, cleaning solutions and sea water;

(4) Excellent adhesion to a wide variety of metallic and non-metallic substrates;
(5) They are relatively easy to process;
(6) Environmentally friendly (low toxicity); and
(7) Relatively low cost.

Another aim of this invention is to provide processes for producing the compositions and their useful end products. Yet another goal is to produce new products that are useful as coatings, adhesives, thin films, molded articles, prepreg, fiber reinforced composites, ceramic powder reinforced microcomposites, flexible printed circuitry, multifunctional smart materials such as sensors and actuators, and light weight foam materials.

DETAILED DESCRIPTION OF THE INVENTION

Although hundreds of polyimides have been developed in the past five decades, it has not been previously disclosed that simple, low cost and readily available raw materials would react to produce a composition like that of the present invention, with a combination of properties that has long been desired in a coating, adhesive or film.

The present invention is based on the unexpected discovery that the condensation reaction of three monomer reactants, BTDA, 3,4'-ODA and NA, in an aprotic solvent will produce a new family of polyimides with unusually high heat, moisture and chemical resistance. This family of polyimides is collectively called LaRC RP 50.

The compositions of the invention have remarkably high thermo-oxidative stability. They can withstand repeated instantaneous temperature surges at temperatures up to 600° C., making them an excellent thermal protecting coating. They also absorb little moisture and are remarkably resistant to moisture induced thermal degradation. They do not swell or degrade when exposed to hydraulic fluids, jet fuels, lubricating oils, strong cleaning solutions or seawater. They show excellent adhesion to a wide variety of metallic, ceramic and other non-metallic substrates.

The polyimides of this invention have been formulated into various compositions in order to vary properties to meet a wide variety of application requirements. The formulated molecular weight (FMW) of the imide prepolymer can be adjusted simply by varying the mole ratio of BTDA:3,4'-ODA:NA using the relation: n:(n+1):2. The value of n varies between 1.0000 d 50.4025, which corresponds to the formulated molecular weight ranging from 978 to 25,000 gram per mole. Table 1 gives representative compositions of the present invention's polyimides.

TABLE 1

Compositions for various imide prepolymers

| No | n Value | Formulated Molecular Weight, g/mole |
|---|---|---|
| 1 | 1.0000 | 978 |
| 2 | 1.2499 | 1100 |
| 3 | 2.0726 | 1500 |
| 4 | 3.1009 | 2000 |
| 5 | 5.1574 | 3000 |
| 6 | 7.2140 | 4000 |
| 7 | 9.2706 | 5000 |
| 8 | 11.3272 | 6000 |
| 9 | 13.3838 | 7000 |
| 10 | 15.4404 | 8000 |
| 11 | 17.4970 | 9000 |
| 12 | 18.5253 | 9500 |
| 13 | 19.5536 | 10,000 |
| 14 | 29.8366 | 15,000 |
| 15 | 40.1195 | 20,000 |
| 16 | 50.4025 | 25,000 |

The heat, moisture, and chemical resistant polyimides of this invention were prepared according to the following general equation (I), showing the synthesis of LaRC™ RP50:

wherein R is selected from the group consisting of and wherein X is selected from the group consisting of

The new materials formed by these reactions are readily processed into high quality films, adhesives, moldings and other products including, but not limited to, a fiber reinforced polymer matrix composite, a cured fiber reinforced polymer matrix composite, a ceramic reinforced polymer matrix composite, a cured neat resin molding, a cured film, a cured adhesive, a cured coating, a cured electric motor coating, a wire coating, a cured fiber optic coating, a cooking ware coating, a bearing molding, a self-lubricating bearing, a heat resistant foam, a circuit board, an electrostatic spray powder coating, a plasma spray powder coating, and a flame spray powder coating. The polyimide may be used in a process for preparing a multi-layer flexible printed circuit board whereby a film prepared from the polyimide is applied to a metal substrate (preferably copper foil) to form a polyimide/metal foil sheet, the sheets are then stacked together, and heat and pressure are applied to form the board. The polyamic acids formed as part of the method of the invention may be similarly incorporated into various products including, but not limited to, an uncured adhesive, an uncured coating, an electric motor coating, a wire coating, a prepreg, a fiber optic coating, a cooking ware coating, a bearing molding, fiber optic coating, a foam molding compound, a film, an electrostatic spray powder coating, a supercritical fluid spray, a dip coating, a spin coating and an electric spin coating.

Excellent results were obtained with the following equation (II) showing a more specific synthesis of LaRC™ RP50:

Excellent results were again obtained with the following equation (III), showing the synthesis of LaRC™ RP50 polyimide with an n value of 17.4970 and a formulated molecular weight of 9000 g/mole (a lightly crossed polyimide), as shown below:

LaRC™ RP50 polyamic acid

200° C.–250° C.
−H₂O | Imidization

LaRC™ RP50 imide prepolymer

Crosslinking
316° C.–350° C.

Lightly Crosslinked Polyimide

The polyimides of the present invention are prepared as follows: BTDA and NA compete for 3,4'-ODA to form a polyamic acid in an aprotic solvent such as N-methylpyrrolidinone (NMP). In order to minimize or eliminate the formation of low molecular weight materials (e.g., mononadimide and bisnadimide), 3,4'-ODA was allowed to react first with BTDA for a period of 5 to 24 hours at room temperature and then NA was added. The reaction was highly exothermic as evidenced by the rapid increase in the temperature of the solution. When 3,4'-ODA powder was added to a solution of BTDA, the results were satisfactory. However, superior results were achieved when BTDA powder was added to a solution of 3,4'-ODA to produce an amine end-capped polyamic acid that reacts with NA to yield an NA end-capped polyamic acid. In order to give a desired range of solution viscosities for direct coating, adhesive and thin film preparation, the solid content of the polyamic acid solution should be between 5 to 35% by weight. A polyamic acid powder can be obtained by precipitating the polyamic acid in warm methanol or water. Alternatively, the polyamic acid solution can be concentrated in a vacuum oven at 100° C. to 250° C. for a subsequent application.

When a thin film of the polyamic acid was cured at 325° C. to 350° C. in the air, the resulting film showed no detectable Tg by DSC. At 552° C. in the air, it had only a 5% weight loss as determined by Thermal Gravimetric Analysis (TGA). The conversion of the polyamic acid into its polyimide can be made by a thermal treatment or by chemical cyclodehydration. Cyclodehydration may be generally defined as a dehydration reaction in which a ringed molecule is formed by the removal of water from an acyclic molecule. When the NMP solution of the polyamic acid was heated at 250° C. in air for 1 hour, an uncrosslinked polyimide was obtained. The crosslinking through the nadic end group occurs at a temperature between 275° C. to 325° C. The cured polyimide can be further postcured at 350° C. to 371° C. to achieve a higher Tg.

As an alternative, acetic anhydride and sodium acetate were added to the polyamic acid solution and then heated to 160° C. to 180° C. The cyclodehydration produced an uncrosslinked imide prepolymer which precipitated out of the NMP solution.

Several aprotic solvents are effective for the synthesis of the polyamic acids and polyimides of this invention. Particularly effective are NMP, N,N-dimethylacetamide (DMAC), N-cyclohexyl-2-pyrrolidinone (NCP), m-cresol and dimethylsulfoxide. Excellent results were obtained using NMP by itself. However, NMP readily absorbs water, which cleaves a polyamic acid chain, resulting in a lower molecular weight polyamic acid; this lower molecular weight polyamic acid in turn produces a lower molecular weight polyimide with inferior properties. It was unexpectedly discovered that the addition of a halogenated solvent (e.g., chloroform or 1,2-dichlorobenzene) to NMP to produce a dual solvent system, which significantly reduced the water absorption and also produced a polyamic acid and polyimide with markedly improved properties. The nature of the interactions between the solvents and between the polymer and the solvents during processing is unclear. One possible explanation involves a dipole—dipole interaction between a chlorinated solvent and NMP, by which the attraction between NMP and water is reduced. Additionally, it is possible that the polyamic acid formed is more soluble in the dual solvent system than in NMP alone and the improved solubility promotes the molecular weight buildup. The preferred weight percent ratio of NMP:chlorinated solvent is between 95:5 to 50:50.

It is well-known that polymer molecular weight strongly affects both polymer melt temperature and viscosity. In this invention, it was found that the melt viscosity of the imide prepolymer rapidly decreased as the formulated molecular weight of the imide prepolymer increased from 978 g/mole to 3000 g/mole, and then it reached a plateau as the formulated molecular weight further increased from 5000 g/mole to 25,000 g/mole.

These high-formulated molecular weight polyimide precursors have high melt viscosities and melt temperatures, and they are difficult to process. Low molecular weight, low melt viscosity additives have been found to be highly effective in lowering the melt viscosities and melt temperatures of the polyimide precursors. Additionally, low viscosity, low melt temperature polymers have also remarkably improved the melt flow properties and thereby processability of the polyimides of this invention. Excellent results have been obtained with additives such as low molecular weight polyimides and their polyamic acid precursors of this invention, benzoin, n-phenylnadimide, a poly(vinylalcohol), a thermoplastic acrylic polymer, a thermosetting acrylic polymer, a halogenated thermoplastic polymer, an epoxyamine resin, a phenolic resin and a silicon resin. (This list of additives is for exemplary purposes, and it should be understood that this specification encompasses any additives known in the art.) However, such additives often lower desirable properties such as thermo-oxidative stability, Tg and elevated temperature mechanical properties. Thus, it is preferred to add 1 to 50% by weight of an additive to lower the melt viscosities of a polyimide and its precursor of this invention.

There are six different ways to prepare an improved melt flow polyimide of this invention. (1) A low molecular weight additive powder can be added to a polyamic acid or an imide powder and the resulting mixture is heated to obtain a polyimide precursor powder; (2) A low melt viscosity polymer powder can be added to a polyamic acid or imide powder and the resulting mixture is heated to obtain a polymer powder; (3) Alternatively, a low molecular weight additive solution (preferably in the same solvent as that used in the polyamic acid) is added and mixed with a polyamic acid solution; (4) A low melt viscosity polymer solution is added and mixed with a polyamic acid solution; (5) Likewise, a low molecular weight additive powder can be added and mixed with a polyamic acid solution; (6) A low melt viscosity polymer can be added and mixed with a polyamic acid solution.

In general, the compositions of the invention may be alternatively formulated to comprise, consist of, or consist essentially of any appropriate components herein disclosed, and such compositions of the invention may additionally, or alternatively, be formulated so as to be devoid, or substantially free, of any components, materials, ingredients, adjuvants or species used in prior art compositions or that otherwise are not necessary to the achievement of the function and objectives of the present invention.

EXAMPLE 1

Preparation of a LARC™RP 50 Polyamic Acid.

3,4'-oxydianiline (3,4'-ODA) (591.9040 g, 2.9560 mole) and 1-methyl-2-pyrrolidinone (NMP) (4637.5 g or 4489.4 ml) were added to a 12-liter, 3 necked round bottom flask equipped with a mechanical stirrer, condenser and nitrogen inlet. The mixture was stirred at room temperature for 1.5 hours, resulting in a brown solution to which 3,3'-4,4'-benzophenonetracarboxylic dianhydride (BTDA) (901.4444 g, 2.7995 mole) was added. After stirring for 16 hours at room temperature, a dark brown viscous solution was obtained and nadic anhydride (NA) (52.4800 g, 0.3200 mole) was added. Stirring continued for an additional 2 hours to yield a dark brown viscous polyamic acid solution. The solution contained 25% solids in NMP and had an inherent viscosity of 0.67 dL/G in NMP at 25° C. It was stored in a freezer for further evaluation.

EXAMPLE 2

Preparation of a LARC™RP 50 Polyamic Acid in a Dual Solvent System of NMP and o-dichlorobenzene (DCB).

3,4'-ODA (591.9040 g, 2.9560 mole), NMP (2318.7500 g, or 2244.6757 ml) and DCB (2318.7500 g or 1776.1394 ml) were added to a 12-liter, 3-necked round bottom flask equipped with a mechanical stirrer, condenser and nitrogen inlet. The solid dissolved and yielded a light brown solution, which was stirred for 1.5 hours at room temperature, followed by the addition of BTDA (901.4444 g, 2.7995 mole). The stirring continued for 16 hours and then NA (52.4800 g, 0.3200 mole) was added. The reaction was stirred for 2 hours, which resulted in a brown viscous polyamic acid solution with an inherent viscosity of 0.99 dL/g, determined at an 0.5% solid solution at 25° C. in NMP.

EXAMPLE 3

Preparation of a LARC™RP 50 Polyamic Acid in a Dual Solvent System of NMP and Chloroform.

3,4'-ODA (591.9040 g, 2.9560 mole), NMP (2318.7500 g or 2244.6757 ml) and Chloroform (2318.7500 g or 1547.4323 ml) were added to a 12-liter, 3-necked round bottom flask equipped with a mechanical stirrer, condenser and nitrogen inlet. After it was stirred at room temperature for 1.5 hrs, BTDA (901.4444 g, 2.7995 mole) was added. The stirring continued for 16 additional hours and then NA (52.4800 g, 0.3200 mole) was added. The reaction was stirred for 2 more hours, which resulted in a brown, viscous polyamic acid solution with an inherent viscosity of 0.87 dL/g in NMP at 25° C.

EXAMPLE 4

Preparation of a LARC™RP 50 Polyamic Acid Powder.

About 500 g of the polyamic acid solution prepared in Example 1 was poured in a small stream into a large household blender, which was two-thirds full of distilled water. The precipitated off-white solid was filtered, and then reslurried in distilled water in the blender, refiltered and reslurried in warm methanol, then refiltered and dried at room temperature for 3 days.

EXAMPLE 5

Preparation of a LARC™RP 50 Polyimide Powder of Example 1.

A 100 g sample of the dried polyamic acid from Example 4 was imidized in an air-circulating oven for 1 hour at 100° C. and 1 hour at 220° C. The resulting imidized polyimide resin was ground into a fine powder. Another method used to prepare the polyimide powder of Example 1 was to imidize the polyamic acid from Example 1 by placing about 500 g of the polyamic acid solution in a baking dish in an air-circulating oven for 2 hours at 125° C. and 1 hour at 200° C. and another hour at 250° C., followed by grinding the resulting imidized material into a fine powder form.

EXAMPLE 6

A LARC™RP 50 polyimide film was prepared with a 50.00 g sample of the polyamic acid solution from Example 1 and was further diluted with 33.33 g of NMP to give a polyamic acid solution with 15 wt % solids. The diluted solution was filtered. Using about 30 ml of the solution, a wet film was cast onto a soda-line glass plate using a 15 ml doctor blade gap. The film was dried in a forced-nitrogen box overnight. It was then cured by heating it in a forced-air oven at 100° C. for 2 hours and 1 hour each at 150° C., 200° C. and 250° C., followed by 2 hours at 325° C. The polyimide film was removed from the glass plate by soaking it in water overnight. The resulting brown film had a Tg of 275° C. and a Tm of 353° C. as determined by DSC at 10° C./min. in air. A 10% weight loss for the polyimide film occurred at 576° C. by TGA at 100° C./min in air. The results of moisture and solvent absoptions characterization are given in Table 2.

EXAMPLE 7

Preparation of a LARC™RP 50 polyimide film according to the procedure of Example 6. A polyimide film was prepared from the polyamic acid solution of Example 2. The resulting polyimide film had no detectable Tg, a Tm of 343° C. and a 10% weight loss at 603° C. Its moisture and solvent absorptions are given in Table 2.

EXAMPLE 8

Preparation of a LARC™RP 50 Polyimide Film in the Same Manner as Example 6.

A polyimide film was prepared from the polyamic acid solution of Example 3. The resulting polyimide film had no detectable Tg, a Tm of 355° C. and a 10% weight loss occurred at 592° C. The Tm observed is most likely due to melting of a crystalline thermoplastic phase. This suggests that the polyimide is a semi-interpenetrating polymer network, which contains both a thermosetting and thermoplastic phase. The relative amount of the thermoset to the thermoplastic is dependant on the synthetic method used. Table 2 shows the moisture and solvent resistant properties of this polyimide film.

EXAMPLE 9

Preparation of a LARC™RP 50 Net Resin Molding.

About 10.00 g of the polyimide powder from Example 5 was placed in a 1.5 inch by 1.5 inch stainless steel mold. The mold was then inserted into a hydraulic press which was preheated to 325° C. A thermocouple was attached to the mold to determine the temperature profile. When the mold temperature reached 250° C., 2000 psi pressure was applied. The temperature was raised to 325° C. The neat resin was cured at 325° C. in the air under 2000 psi for 2 hours and then cooled to 150° C. before it was removed from the pressure. The resulting neat resin showed no visible defects. It had a density of 1.33 g/cc and a Tg of 272° C. by DSC and a 10% weight loss at 512° C. as determined by TGA at 2.5° C./min in air.

EXAMPLE 10

Preparation of a LARC™RP 50 Prepreg.

Approximately 2500.00 g of the polyamic acid solution from Example 1 was used to coat an unsized IM-7 graphite fiber (Hercules, Inc.) on a tape machine. This yielded approximately 8.25 inch wide by 150 ft long high quality prepreg with good tack characteristics. The prepreg had a resin content ranging from 35 to 37 wt %, an area weight of 144 g/m$^2$ and volatile content varying from 15 ro 18 wt %. The prepreg was stored in a freezer for composite fabrication and characterization.

EXAMPLE 11

Preparation of a LARC™Rp 50 Composite.

The prepreg from Example 10 was cut into 1 inch by 1 inch plies and 12 plies were stacked unidirectionally. The composite panel was compression molded in a vacuum press by applying a full vacuum and heating it at 250° C. After it was heated at 250° C. for 1 hour, 1000 psi pressure was applied. The composite was cured at 325° C. under 1000 psi pressure for 1 hour. The resulting composite was C-scanned and showed some voids in the center region. It was cut into specimens and tested for flexural properties according to ASTM D790 and short beam shear strength according to ASTM D2344.

EXAMPLE 12

Preparation of an Adhesive Bonding.

Adhesive tape was prepared by applying the polyamic acid solution prepared in Example 1 to a 112 E glass cloth with 1100 finish, and drying it at a final temperature of 150 degrees Celsius for 1 hour. Several coats were made to obtain adequate tape thickness. Titanium (ti-6Al-4V) surface was treated with a Pasagel 107. TM. This was followed by priming the surface with a 5 wt % solution of the polyamic acid and drying it at a final temperature of 125 degrees Celsius for 1 hour. Lap shear specimens were cured at 325 degrees Celsius for 1 hour under 100 psi pressure and then tested according to ASTM D 1002.

EXAMPLE 13

Preparation of an N-phenylnadimide Additive.

A mixture of NA (16.40 g, 0.10 mole) and aniline (9.30 g, 0.10 mole) in 25 ml of acetonitrile was refluxed overnight under nitrogen. The product was precipitated in water, washed with methanol and dried at room temperature for 3 days.

EXAMPLE 14

Preparation of a LaRC RP50 Polyimide Composition Containing 10% by Weight of the N-phenylnadimile Additive.

A solution comprised of 84.24 g of the polyamic acid solution prepared in Example 1 and 2.00 g of the N-phenylnadinmide additive prepared in Example 13 was stirred at room temperature for 1 hour. The solution was then poured into stirred, distilled water contained in a household blender, filtered, washed with warm water and then warm methanol, air dried overnight and imidized in forced air for 1 hour at 100 degrees Celsius and 1 hour at 220 degrees Celsius. The resulting light grey solid was pulverized in a grinder to yield a fine polyimide powder.

EXAMPLE 15

Preparation of LaRC RP50 Polyamic Acid Composition Containing 10% by Weight of a Poly(methylmethacrylate) Additive.

Commercial poly(methylmethacrylate) powder (2.11 g) was added to 84.2 g of the polyamic acid solution prepared in Example 1. The mixture was stirred at room temperature under nitrogen for several hours to give a viscous brown solution.

EXAMPLE 16

Preparation of a LaRC RP50 Polyamic Acid Composition Containing 10% by Weight of a Poly(vinylalcohol) Additive.

As in Example 15, 2.11 g of a commercial poly (vinylalcohol) powder was added to 84.2 g of the polyamic solution prepared in Example 1. After it was stirred at room temperature under nitrogen for several hours, a viscous light brown solution was produced.

TABLE 2

Preliminary Moisture and Solvent Absorptions of the Polyimide Films of this Invention Compared to Those of Commercial Polyimide Films

| | Absorption, weight % *,** | | | | |
|---|---|---|---|---|---|
| | | | | Commercial Polyimide Film | |
| | Polyimide Films of this Invention | | | Kapton | UpilexS |
| Fluid | Ex. 6 | Ex. 7 | Ex. 8 | DuPont | ICI |
| JP-5 (Jet Fuel) | 0.00 | 0.00 | 0.00 | −0.62 | −1.07 |
| Lubricating Oil | 0.67 | 0.00 | 0.00 | 14.50 | −1.22 |
| SKYDROL (Hydraulic Fluid) | 0.21 | 0.00 | 0.00 | 10.17 | 0.54 |
| Alkaline Cleaning Solution | 0.45 | 0.63 | 0.72 | 4.64 | 1.49 |
| Water | 0.00 | 0.00 | 0.00 | 0.84 | 0.45 |
| Sea Water | 0.00 | 0.00 | 0.00 | — | 0.55 |

Notes:
*All polyimide films were submerged in each of the fluids for 7 days at ambient temperature.
**All polyimide films showed no swell, no cracks, good toughness and flexibility after 7 days/RT exposure.

I claim:

1. A heat, moisture, and chemical resistant polyimide compound and precursors thereof comprising the reaction products of a mixture of the following monomer reactants:

nadic anhydride (NA)

3,4'-oxydianiline (3,4'-ODA)

wherein R is selected from the group consisting of

, and and wherein X is selected from the group consisting of

2. A heat, moisture, and chemical resistant polyimide compound prepared by the process of reacting 3.4'-oxydianiline (3.4'-ODA) with 3.3',4.4'-benzophenonetetracarboxylic dianhydride (BTDA) and nadic anhydride (NA) in a solvent.

3. The heat, moisture, and chemical resistant polyimide of claim 2, wherein said solvent is selected from the group consisting of 1-methyl-2-pyrrolidinone (NMP), N,N-dimethylacetamide (DMAC), N-cyclohexyl-2-pyrrolidinone (NCP), m-cresol, and dimethylsulfoxide.

4. A product comprising the polyimide compound of claim 2, said product being selected from the group consisting of a fiber reinforced polymer matrix composite, a cured fiber reinforced polymer matrix composite, a ceramic reinforced polymer matrix composite, a cured neat resin molding, a cured film, a cured adhesive, a cured coating, a cured electric motor coating, a wire coating, a cured fiber optic coating, a cooking ware coating, a bearing molding, a self-lubricating bearing, a heat resistant foam, a circuit board, an electrostatic spray powder coating, a plasma spray powder coating, and a flame spray powder coating.

5. The heat, moisture, and chemical resistant polyimide compound of claim 2 in combination with an additive.

6. The heat, moisture, and chemical resistant polyimide compound of claim 2 in combination with an additive, said additive being selected from the group consisting of benzoin, n-phenylnadimide, a poly(vinylalcohol), a thermoplastic acrylic polymer, a thermosetting acrylic polymer, a halogenated thermoplastic polymer, an epoxy-amine resin, a phenolic resin, and a silicon resin.

7. The heat, moisture, and chemical resistant polyimide compound of claim 2, wherein the mole ratio of NA:BTDA:3.4' ODA is 2:n:(n+1), wherein n has a value from 1 to 50.4025.

8. The heat, moisture, and chemical resistant polyimide compound of claim 7, wherein the formulated molecular weight is 9000 g/mole and n has a value of 17.4970.

9. The heat, moisture, and chemical resistant polyimide compound of claim 7, wherein the formulated molecular weight is 10,000 g/mole and n has a value of 19.5536.

10. The heat, moisture, and chemical resistant polyimide compound of claim 7, wherein the formulated molecular weight is 20,000 g/mole and n has a value of 40.1195.

11. The heat, moisture, and chemical resistant polyimide compound of claim 7, wherein the formulated molecular weight is 25,000 g/mole and n has a value of 50.4025.

12. The heat, moisture, and chemical resistant polyimide compound of claim 7, wherein the formulated molecular weight is 978 g/mole and n has a value of 1.000.

13. The heat, moisture, and chemical resistant polyimide compound of claim 7, wherein the formulated molecular weight is 1100 g/mole and n has a value of 1.2499.

14. The heat, moisture, and chemical resistant polyimide compound of claim 7, wherein the formulated molecular weight is 1500 g/mole and n has a value of 2.0726.

15. The heat, moisture, and chemical resistant polyimide compound of claim 7, wherein the formulated molecular weight is 3000 g/mole and n has a value of 5.1574.

16. The heat, moisture, and chemical resistant polyimide compound of claim 7, wherein the formulated molecular weight is 5000 g/mole and n has a value of 9.2706.

17. The heat, moisture, and chemical resistant polyimide compound of claim 7, wherein the formulated molecular weight is 7000 g/mole and n has a value of 13.3838.

18. A low melt temperature, low melt viscosity mixture comprising the polyimide of claim 7 and an additive, said additive being the reaction product of 3.4'-oxydianiline (3.4'-ODA) with 3.3',4.4'-benzophenonetetracarboxylic dianhydride (BTDA) and nadic anhydride (NA) in a solvent, wherein the additive mole ratio of NA:BTDA:3.4' ODA is 2:n:(n+1), and where the additive n is a number selected from the group consisting of 1.0000, 1.2499, 2.0726, 5.1574, 9.2706, and 13.3838.

19. The heat, moisture, and chemical resistant polyimide compound according to claim 2, wherein said solvent is a dual solvent system.

20. The heat, moisture, and chemical resistant polyimide compound according to claim 19, wherein said dual solvent system comprises a high boiling aprotic solvent and a chlorinated solvent.

21. The heat, moisture, and chemical resistant polyimide of claim 20, wherein said high boiling aprotic solvent is NMP and said chlorinated solvent is 1,2-dichlorobenzene.

22. The heat, moisture, and chemical resistant polyimide of claim 20, wherein said high boiling aprotic solvent is NMP and said chlorinated solvent is chloroform.

23. A method for processing polyimides and precursors thereof formed by the reaction of 3.4'-oxydianiline (3.4'-ODA), 3.3',4.4'-benzophenonetetracarboxylic dianhydride (BTDA), and nadic anhydride (NA), the method comprising the steps of:

(A) precipitating the polyimide precursor in hot water, (B) washing the precipitate with warm methanol, (C) imidizing the precipitate through the application of heat to form a polyimide powder.

24. The method for processing the polyimide compound of claim 23, wherein the imidizing step (C) is followed by the step of compression molding the polyimide powder to form a film.

25. An imide prepolymer having the following general structural formula:

wherein n is a number between 1 and 50.4025.

26. The imide prepolymer of claim 24, wherein n=17.4970.

27. A polyamic acid precursor having the following general structural formula:

wherein n is a number between 1 and 50.4025.

28. The polyamic acid precursor of claim 27, wherein n=17.4970.

29. A product comprising the polyamic acid precursor of claim 27, said product being selected from the group consisting of an uncured adhesive, an uncured coating, an electric motor coating, a wire coating, a prepreg, a fiber optic coating, a cooking ware coating, a bearing molding, an uncured adhesive tape, a foam molding compound, a film, an electrostatic spray powder coating, a supercritical fluid spray, a dip coating, a spin coating, and an electric spin coating.

30. A low melt temperature, low melt viscosity mixture prepared from at least one polyamic acid precursor of claim 27 and at least one additive.

31. The low melt temperature, low melt viscosity mixture of claim 30, wherein said at least one additive is selected from the group consisting of benzoin, n-phenylnadimide, a poly(vinylalcohol), a thermoplastic acrylic polymer, a thermosetting acrylic polymer, a halogenated thermoplastic polymer, an epoxy-amine resin, a phenolic resin, and a silicon resin.

32. A method for processing a polyamic acid precursor, the method comprising the steps of:

(a) precipitating the polyamic acid precursor in water, (b) washing the polyamic acid precursor precipitate with hot water and warm methanol, and

(c) drying the polyamic acid precursor precipitate to a polyamic acid precursor powder; wherein the polyamic acid precursor has the following chemical formula:

wherein n is between 1 and 50.4025.

33. The method for processing a polyamic acid precursor of claim 32, wherein the drying step (c) is followed by the step of compression molding the polyamic acid powder by application of heat and pressure to form a film.

34. A low melt temperature, low melt viscosity mixture comprising at least one polyamic acid precursor and at least one polyimide, wherein said at least one polyamic acid precursor has the following general structural formula:

where n is a number between 1.0000 and 50.4025; and wherein said at least one polyimide has the following general structural formula:

where n is a number selected from the group consisting of 1.0000, 1.2499, 2.0726 5.1574, 9.2706, and 13.3838.

35. A process for preparing heat, moisture, and chemical resistant polyimides and precursors thereof, which comprises: reacting the following monomer reactants:

wherein R is selected from the group consisting of and wherein X is selected from the group consisting of by the application of heat.

36. A process according to claim 35, wherein the heat is applied at a temperature at or below 150° C.

37. A process according to claim 35, wherein the heat is applied at a temperature at or below 250° C.

38. A process according to claim 35, wherein the heat is applied at a temperature at or below 310° C.

39. A process according to claim 35, wherein the heat is applied at a temperature between 325° C. to 371° C.

40. A method for making a polyimide, comprising the steps of:
(a) reacting 3,4'-ODA with BTDA and NA in a solvent to form a polyamic acid precursor;
(b) converting the polyamic acid precursor to form an imide prepolymer, and
(c) heating the imide prepolymer to provide a polyimide.

41. The method for making a heat, moisture, and chemical resistant polyimide of claim 40, wherein the converting step (b) further comprises converting the polyamic acid precursor to an imide prepolymer by applying heat.

42. The method for making a polyimide of claim 40, wherein the heating step (c) further comprises heating the imide prepolymer to a temperature of up to 250° C. to provide an uncrosslinked polyimide.

43. The method for making a polyimide of claim 40, wherein the heating step (c) further comprises heating the imide prepolymer to a temperature of between 275° C. and 350° C. to provide a crosslinked polyimide.

44. The method for making a polyimide of claim 40, wherein the heating step (c) is followed by a step (d) of post-curing the polyimide by applying heat to a temperature of between 350° C. to 371° C.

45. The method for making a heat, moisture, and chemical resistant polyimide of claim 40, wherein the converting step (b) further comprises cyclodehydrating the polyamic acid precursor in a high boiling, polar aprotic solvent.

46. The method for making a heat, moisture, and chemical resistant polyimide of claim 40, wherein the converting step (b) further comprises cyclodehydrating the polyamic acid precursor by adding acetic anhydride and sodium acetate to the polyamic acid solution and heating to between 160° C. and 180° C. to form an uncrosslinked imide prepolymer.

47. The method for making a heat, moisture, and chemical resistant polyimide of claim 40, wherein the solvent is a member selected from the group consisting of 1-methyl-2-pyrrolidinone (NMP), N,N-dimethylacetamide (DMAC), N-cyclohexyl-2-pyrrolidinone, m-cresol, and dimethylsulfoxide.

48. A process for preparing a multi-layer flexible printed circuit board, which process comprises:
(a) preparing a film from a polyimide made by reacting 3,4'-ODA with BTDA and NA,
(b) applying the polyimide film to a metal substrate to form a polyimide/metal foil sheet,
(c) stacking a plurality of polyimide/metal foil sheets together to form a polyimide/metal foil stack, and
(d) applying heat and pressure to the polyimide/metal foil stack to form a multi-layer flexible printed circuit board.

49. A multi-layer flexible printed circuit board of claim 48, wherein the metal substrate is copper foil.

* * * * *